United States Patent [19]

Zambrano

[11] Patent Number: 5,597,742
[45] Date of Patent: Jan. 28, 1997

[54] SEMICONDUCTOR DEVICE AND METHOD

[75] Inventor: Raffaele Zambrano, San Giovanni la Punta, Italy

[73] Assignee: Consorzio per la Ricerca Sulla Microelettronica Nel Mezzogiorno, Italy

[21] Appl. No.: 442,015

[22] Filed: May 16, 1995

Related U.S. Application Data

[62] Division of Ser. No. 869,760, Apr. 16, 1992, Pat. No. 5,432,376.

[30] Foreign Application Priority Data

Apr. 17, 1991 [EP] European Pat. Off. ............. 91830151

[51] Int. Cl.$^6$ .................................................. H01L 21/265
[52] U.S. Cl. ............................ 437/31; 437/59; 437/67; 437/74; 437/78; 437/90
[58] Field of Search ............................... 437/31, 32, 154, 437/55, 61, 63, 64, 67, 78, 89, 90, 59, 74

[56] References Cited

U.S. PATENT DOCUMENTS

| | | | |
|---|---|---|---|
| 4,379,726 | 4/1983 | Kumamaru et al. | 437/154 |
| 4,780,430 | 10/1988 | Musumeci et al. | 437/154 |
| 5,034,337 | 3/1991 | Mosher et al. | |

FOREIGN PATENT DOCUMENTS

| | | |
|---|---|---|
| 0339732 | 11/1989 | European Pat. Off. . |
| 56-74940 | 6/1981 | Japan . |
| 56-87360 | 7/1981 | Japan . |
| 57-26462 | 2/1982 | Japan . |
| 60-58633 | 4/1985 | Japan . |
| 60-196936 | 10/1985 | Japan . |

OTHER PUBLICATIONS

S. M. Sze, "Semiconductor Devices Physics and Technology", 1985, pp. 110–111.

*Primary Examiner*—Tuan H. Nguyen
*Attorney, Agent, or Firm*—Felsman, Bradley, Gunter & Dillon, LLP

[57] ABSTRACT

The base region of the power stage and the horizontal isolation region of the integrated control circuit or collector region of a transistor of an integrated circuit consist of portions of an epitaxial layer with a first conductivity type grown in sequence on an underlying epitaxial layer with a second conductivity type opposite the first.

4 Claims, 5 Drawing Sheets

SEMICONDUCTOR DEVICE AND METHOD

This is a division of application Ser. No. 07/869,760, filed Apr. 16, 1992, now U.S. Pat. No. 5,432,376.

BACKGROUND OF THE INVENTION

1. Field of the Invention

The present invention relates generally to semiconductor devices, and more specifically to semiconductor devices containing both a power transistor and integrated control circuitry.

2. Description of the Prior Art

An object of the present invention is to provide a monolithic semiconductor device containing an integrated control circuit and at least one power transistor integrated into the same chip. Another object is to provide a process for manufacturing such a device.

In known monolithic devices of the above-mentioned type, the control circuit usually comprises several low voltage transistors. A P-type diffused horizontal isolation (DHI) region is obtained by selective dopant implantation and subsequent diffusion. The DHI region gives rise, together with the collector regions of the power transistor and an N-type buried layer (BL FIG. 1), to a parasitic NPN transistor whose firing should be avoided. This involves the formation of a very deep junction and very critical dopant profile design.

These design constraints reflect adversely on device performance, cost, and production yields.

A monolithic semiconductor device fabricated in accordance with the present invention overcomes these drawbacks and provides additional advantages.

SUMMARY OF THE INVENTION

Therefore, in accordance with the present invention, fabrication of a semiconductor device in accordance with the present invention involves the formation of an epitaxial horizontal isolation layer during epitaxial growth of the device. Epitaxial growth of this layer allows a dopant profile to be obtained which improves the operating characteristics of the device. This epitaxial isolation layer, in additional to isolating low voltage transistors in the control circuitry, serves as the base for the power transistor.

BRIEF DESCRIPTION OF THE DRAWINGS

The invention will be further clarified by the description given below and the annexed drawings of an example of the known art and nonlimiting examples of embodiments of the invention in which.

DESCRIPTION OF THE PREFERRED EMBODIMENT

In summary, the device of the present invention includes at least one transistor of an integrated control circuit, a horizontal isolation region for such control circuit, and at least one bipolar power transistor integrated on the same chip. The power transistor and control circuit transistor may both be of type NPN or PNP.

In one preferred embodiment, the chip includes a substrate having a first conductivity type and three overlying epitaxial layers. The first and third epitaxial layers are also of the first conductivity type, with the second epitaxial layer having a second, opposite conductivity type.

The second conductivity type epitaxial layer may have either uniform or variable dopant concentration. In the case of variable dopant concentration, higher doping levels are used at the interface with the underlying epitaxial layer, and lower doping levels are used at the interface with the upper epitaxial layer. Both the horizontal isolation region of the control circuit and the base region of the power transistor are formed from portions of the second epitaxial layer.

Figure 1:
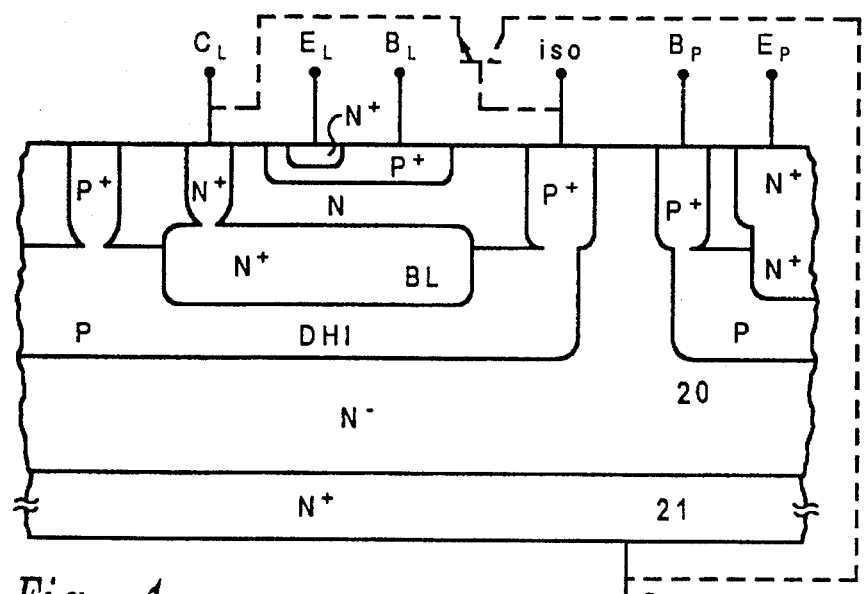
FIG. 1 shows a monolithic semiconductor device in accordance with the known art comprising an integrated control circuit and a power stage integrated in the same chip.

FIG. 1 shows schematically the structure of a monolithic semiconductor device in accordance with the known art. This device includes an integrated control circuit and a power stage integrated in the same chip. For the sake of simplicity, a single component of the integrated control circuit is shown. This is a low voltage NPN transistor having emitter, base and collector terminals labeled $E_L$, $B_L$ and $C_L$. Also, only a single NPN power transistor is shown, having emitter, base and collector terminals $E_P$, $B_P$ and $C_P$.

The device includes a horizontal isolation region for the integrated control circuit, indicated by the reference DHI (diffused horizontal isolation). The DHI region and the power transistor base are provided by P-type regions obtained by a selective implantation process followed by a diffusion cycle.

The dopant concentration for this DHI region is determined on the basis of two opposing requirements:

1. the need for low dopant concentrations to increase the operating voltage of the integrated control circuit components. For example, to obtain a 60 volt breakdown voltage of the insulation region, a peak dopant concentration of $10^{16}$ atoms/m$^3$ typically must not be exceeded; and 2. the need for high dopant concentrations to reduce gain of the NPN parasitic transistor shown in broken lines in FIG. 1. This also includes the reverse parasitic transistor, obtained by exchanging the emitter and collector of the broken line transistor.

Formation of the N-type buried layer (BL region) tends to partially compensate for the dopant used to form the DHI region. This consequently increases both the resistivity of the DHI region and the gain of the NPN parasitic transistor described above.

The parameters of the power stage penalized by the above-mentioned compromise solution are the reverse breakdown safe operating area (RBSOA) and the switching characteristics. These result because of the high intrinsic base resistance $r_{bb}$.

Heavy diffusions are therefore required for the DHI region so as to avoid excessive compensation for this region by the BL region. This can result in a junction depth after diffusion which is greater than 10 microns. Another result of this fabrication process is a considerable rise of the substrate region 21 which is doped with antimony. This requires an increase in the thickness of the first epitaxial layer 20, which increases costs and reduces production yield.

The manufacturing process sequence of the device which is the object of the present invention is shown schematically in FIGS. 2–7. For the sake of simplicity, only one component of the integrated control circuit is shown (a low voltage NPN transistor). Also, only a single power transistor, also NPN, is illustrated.

Figure 2:
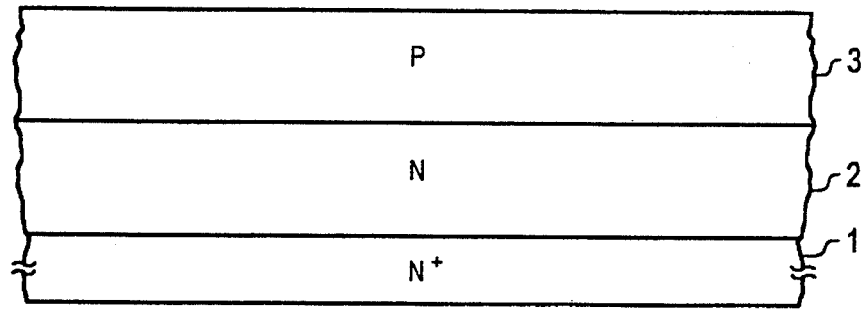
FIGS. 2–7 shows the steps of a manufacturing process for a device in accordance with the present invention.
Figure 3:
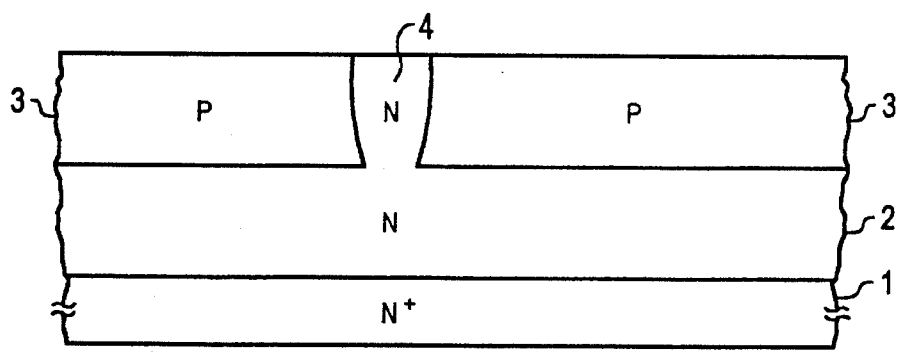
Figure 4:
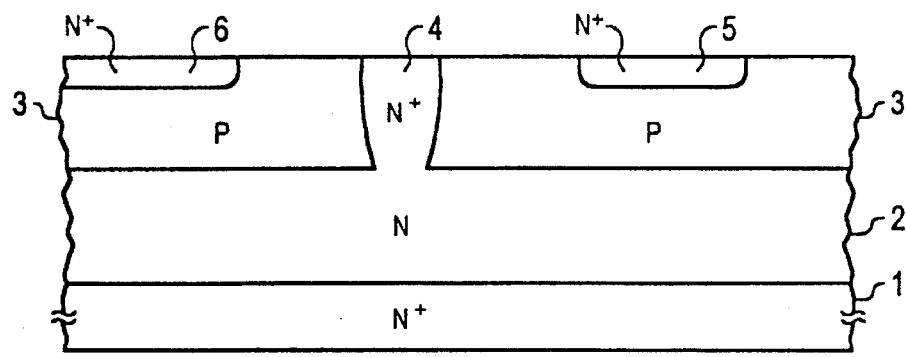
Figure 5:
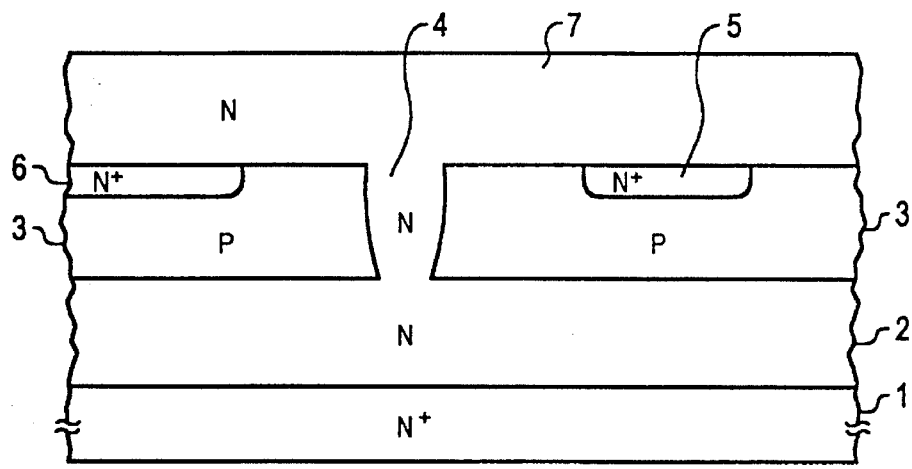

The sequence provides:

1. growth of an N-type epitaxial layer 2 on an N+ substrate 1 (FIG. 2);

2. growth of a p-type epitaxial layer 3 on the preceding N-type epitaxial layer 2. This second growth takes place immediately after the previous one without any intervening operations;

3. definition of the diffused region 4 separating the integrated control circuit from the power stage (FIG. 3);

4. definition of the region 5 for formation of an N-type buried layer for the integrated control circuit and 6 for formation of the power transistor emitter (FIG. 4);

5. growth of another N-type epitaxial layer 7 (FIG. 5);

6. formation of the regions 8 to isolate the integrated control circuit components from each other and from the power transistor (FIG. 6); and 7. provision of the sink regions 9 to connect the buried layer 5 and the emitter 6 to the surface.

Figure 7:
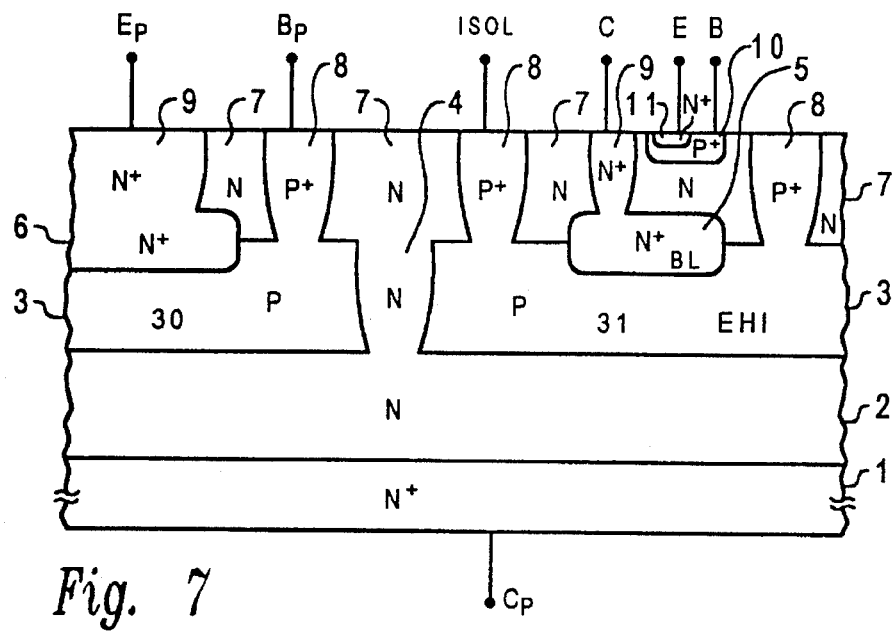

The final structure obtained in accordance with the above process is illustrated in FIG. 7. Reference number 30 indicates the base region of the power transistor, and 31 the horizontal isolation region of the integrated control circuit.

The structure of FIG. 7 differs from prior art structures in that the DHI regions are replaced by epitaxial horizontal isolation (EHI) regions of the P-type epitaxial layer 3. As already mentioned, epitaxial layer 3 is grown after the N-type epitaxial layer 2 as part of a single step, or in two distinct steps without other intervening operations.

The dopant concentration of the epitaxial layer 3 is uniform throughout and equal to the P concentration of the corresponding prior art diffused region. Resistivity of the EHI regions, and gain of the parasitic transistor, are therefor simultaneously minimized.

It is also possible to grow an epitaxial layer 3 which has a varied doping profile. For example, layer 3 can be more highly doped at the interface with epitaxial layer 2 than at the interface with epitaxial layer 7. This profile is obtained by varying the flow of dopant in the reactor used for epitaxial growth. Such an epitaxial layer with varied doping further reduces the resistivity of the horizontal isolation region and the gain of the parasitic transistor without compromising the maximum operating voltage of the integrated control circuit components.

The structure of FIG. 7 provides advantageous features for the power stage also. The bipolar power transistor has an epitaxial base, and it is known that this makes it possible to reduce the $r_{bb}$ and thus obtain switching and robustness characteristics better than those of a transistor with a diffused base region. This presumes that the P concentration of the analogous diffused base region is equal to the dopant concentration of the epitaxial layer, resulting in a reduced extrinsic base resistance. In addition, the base region can be further doped where necessary by selective implantation.

The operating characteristics of the power transistor are improved because the emitter region dopant has a doping profile which maximizes the efficiency of such region.

It will be appreciated that variations on the above-described process are possible. Two alternative embodiments call for the omission of step 3 above.

Figure 8A:
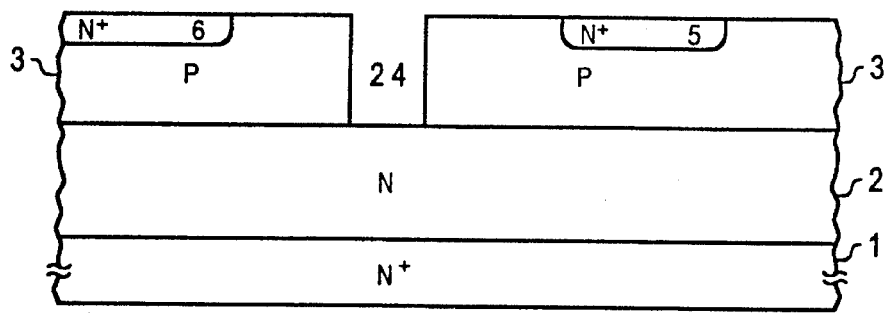
FIGS. 8a and 8b show a first alternative embodiment of the manufacturing process of FIGS. 2–7.
Figure 8B:
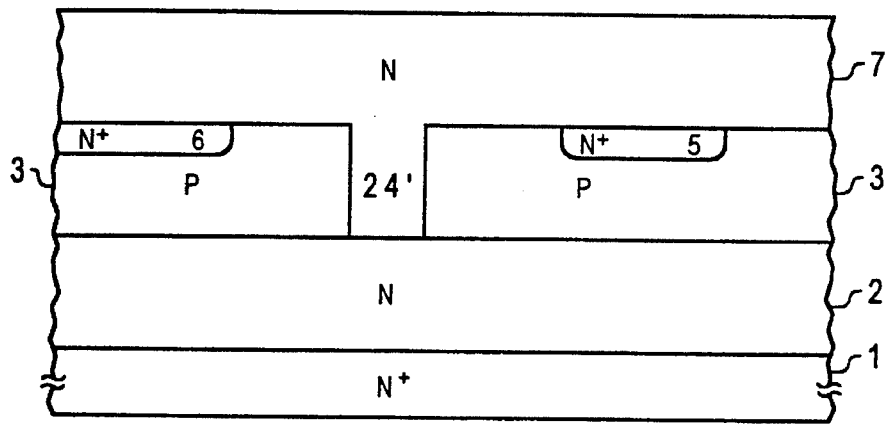

In accordance with a first alternative embodiment, the region 4, which isolates the power stage from the integrated control circuit, can be provided without formation of a diffused region. This is done by etching, before step 5, a groove or trench 24 in the epitaxial layer 3 by selective anisotropic etching of such layer. (FIG. 8a) The trench is then filled by the epitaxial layer 7 during its growth so as to result in, at the end of step 5 above, region 24' as shown in the structure of FIG. 8b.

Figure 6:
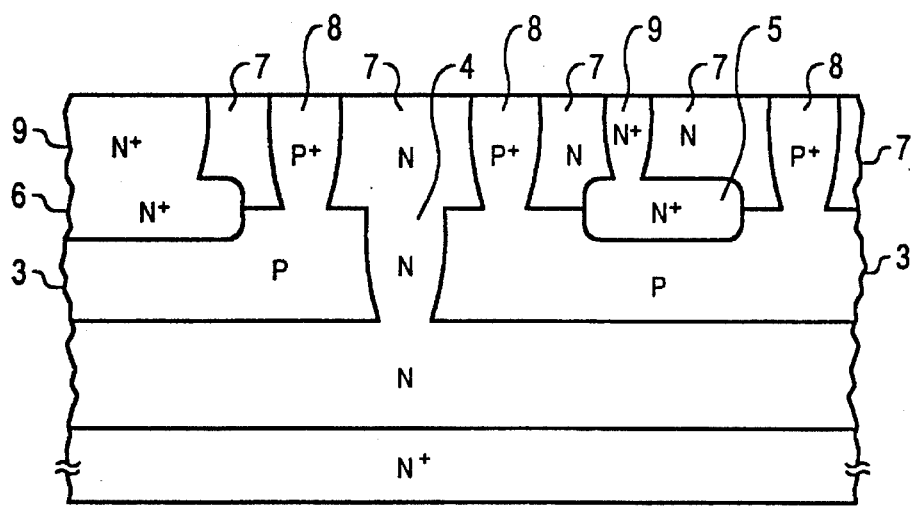

In accordance with the second alternative embodiment, the region 4 and the region 7 overlying region 4 of FIG. 6 are replaced by a trench 14 through the layers 3 and 7 for their entire depth. Trench 14 also extends part way into layer 2. Trench 14 is formed by selective anisotropic etching as described above after step 5 so as to arrive at the structure of FIG. 9a. Subsequently, before beginning step 6, the trench 14 is filled with dielectric material, silicon dioxide for example, as shown in FIG. 9b.

It will be appreciated that the structure in accordance with the several alternative embodiments can be used, in a manner which will be apparent to those skilling in the art, for the construction of devices with integrated control circuits containing PNP transistors with vertical current flow. An example of this type of transistor is found in U.S. Pat. No. 4,898,836, issued to SGS-Thomson Microelectronics. For this situation, the EHI region serves as the collector for the PNP transistors.

Figure 10:
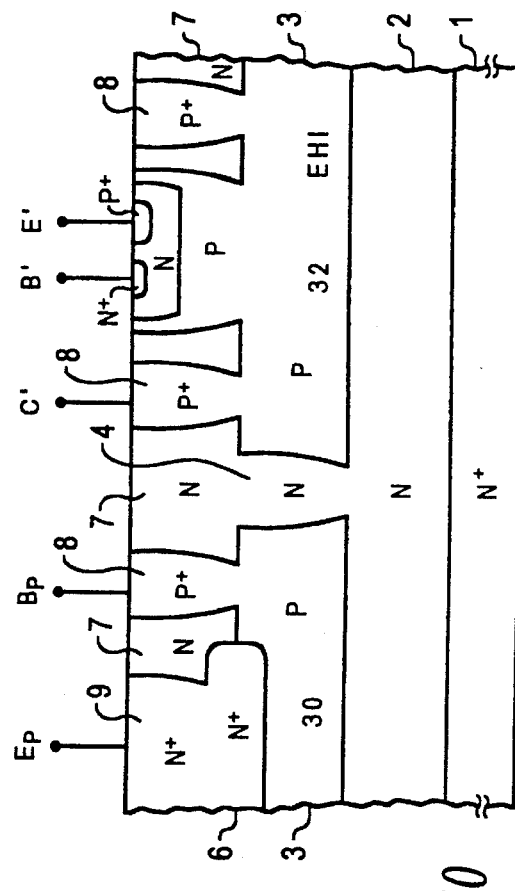
FIG. 10 shows an example of a structure with a power stage comprising an NPN transistor and an integrated control circuit comprising a PNP transistor.

FIG. 10 shows an example of a structure with the power stage comprising an NPN transistor and an integrated control circuit containing a PNP transistor. The collector region of the PNP transistor, indicated by reference number 32, is connected to the electrode C'. The base and emitter regions are connected to the electrodes B' and E', respectively.

Figure 11:
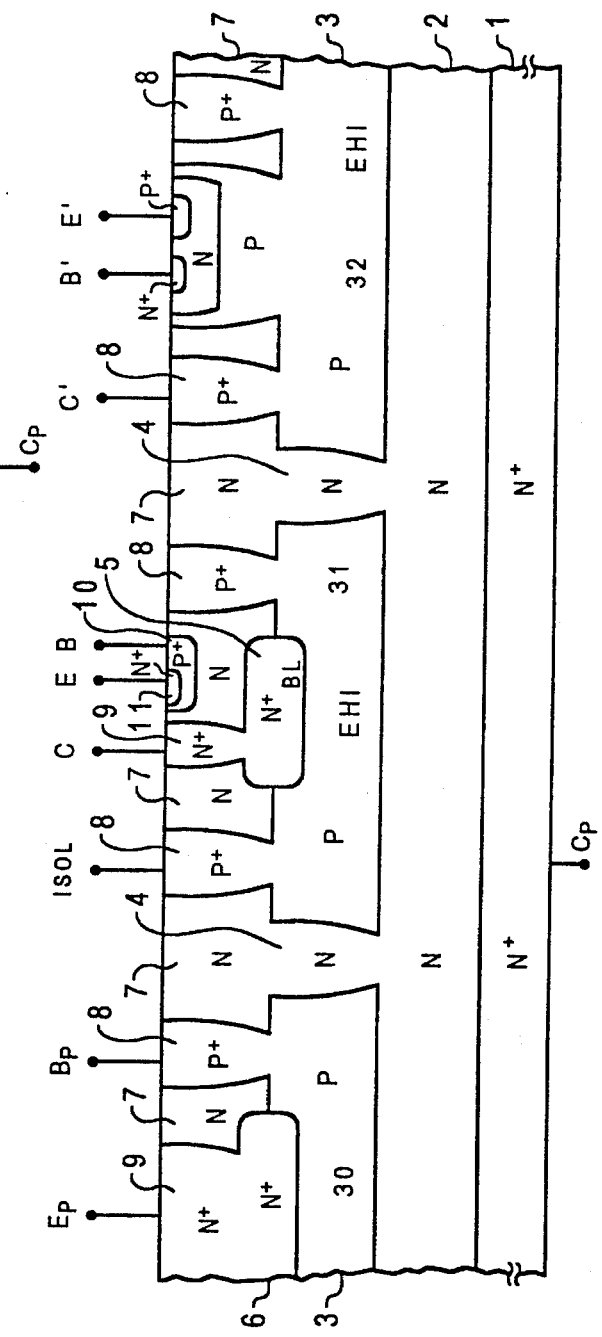
FIG. 11 shows an example of the structure with power stage comprising an NPN transistor and an integrated control circuit comprising both an NPN transistor and a PNP transistor.

FIG. 11 shows an example of a structure with a power stage containing an NPN transistor, and an integrated control circuit containing both an NPN transistor and a PNP transistor.

If it is desired to provide a PNP power transistor, it is sufficient to repeat the structures and processes described with reference to FIGS. 2–11 by reversing the conductivity type of the various layers and regions. Thus, the structure would begin from a P-type substrate, etc.

The above description of the preferred embodiments makes clear many of the advantages of the structure obtained by the described process. As compared with structures obtained by the prior art processes, the differences may be summarized as follows:

1. simultaneous minimization of the resistivity of the horizontal isolation region and the gain of the parasitic transistors;

2. optimization of the power stage performance as a result of reducing the extrinsic base resistance;

3. reduction of the thickness of the first epitaxial layer because heavy diffusions for the DHI regions are no longer necessary.

Figure 9A:
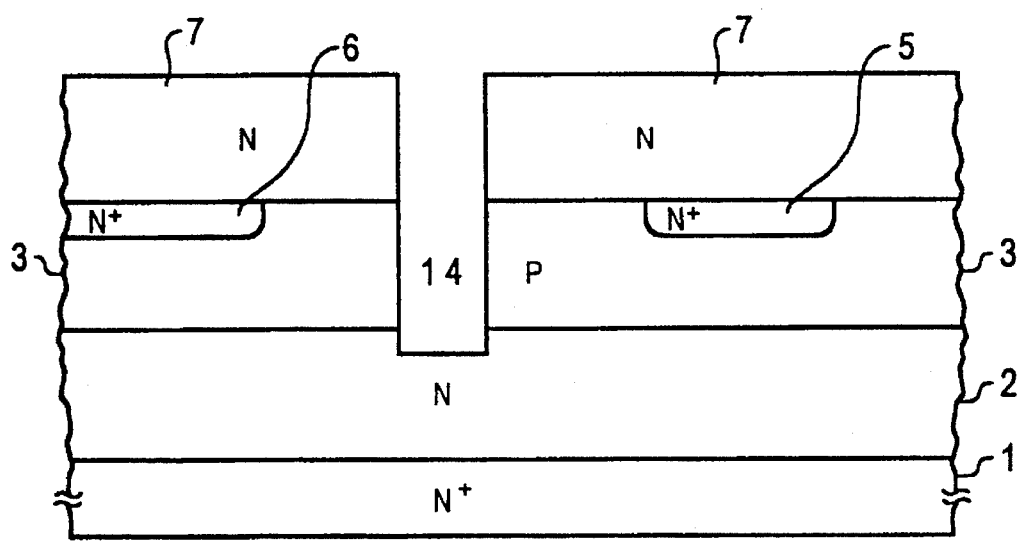
FIGS. 9a and 9b show a second alternative embodiment of the manufacturing process of said figures.
Figure 9B:
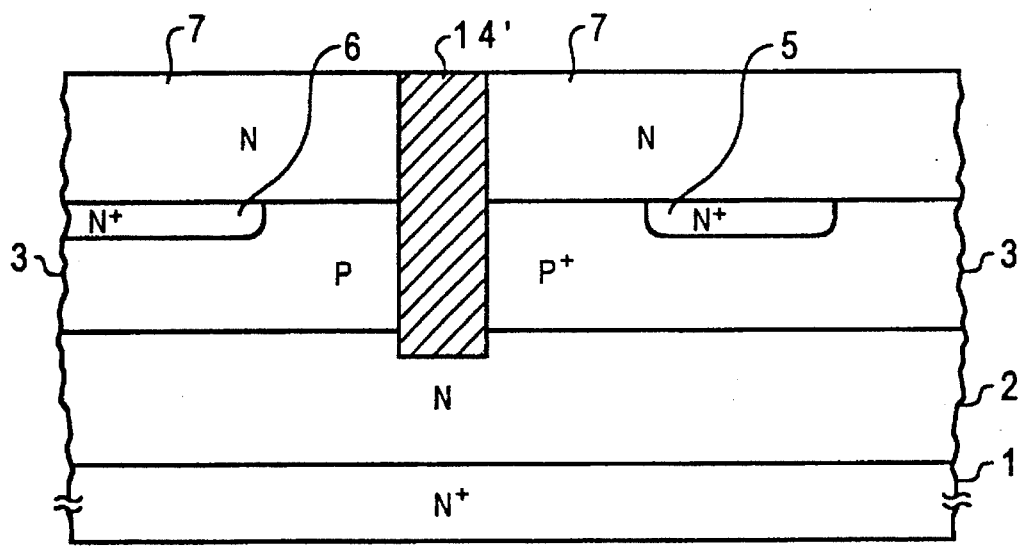

The following two additional advantages apply essentially to the process and structure shown in FIGS. 9a and 9b:

4. The regions which are subjected to high voltages, i.e., those between the layers 2 and 3, are flat. Thus, it is not necessary to use termination techniques, with a resulting saving of area and processing costs; and 5. the doping of the epitaxial layer 7 is independent of the operating voltage of the power stage because there are no regions in which it makes contact with the epitaxial layer 2.

The preferred embodiments described above illustrate a power stage provided with a single transistor. But the invention is equally applicable to a power stage having several transistors, such as darlington or trilington transistors.

While the invention has been particularly shown and described with reference to a preferred embodiment, it will be understood by those skilled in the art that various changes in form and detail may be made therein without departing from the spirit and scope of the invention.

What is claimed is:

1. A process for the manufacture of a monolithic semiconductor device having an integrated control circuit, a horizontal isolation region of said circuit and at least one bipolar power transistor integrated in the same chip, comprising the steps of:

growing a first epitaxial layer with a first conductivity type on a substrate with the same conductivity type;

growing a second epitaxial layer with a second conductivity type opposite to the first conductivity type on the first epitaxial layer;

defining, in the second epitaxial layer, a region with the first conductivity type to create a buried layer of the integrated control circuit, and further defining a region with the first conductivity type designed to form the emitter of the power transistor;

forming a trench through the second epitaxial layer between the buried layer and the emitter;

growing a third epitaxial layer with the first conductivity type, wherein the third epitaxial layer fills the trench through the second epitaxial layer to form an isolation region between the power transistor and the control circuit;

providing, in the third epitaxial layer, regions with the second conductivity type designed to isolate the integrated control circuit components from each other; and providing, in the third epitaxial layer, sink regions designed to connect at the surface the buried layer of the integrated control circuit and the power transistor emitter.

2. The method of claim 1, wherein the step of forming the trench comprises the step of forming the trench through the second epitaxial layer by selective anisotropic etching.

3. A process for the manufacture of a monolithic semiconductor device having an integrated control circuit, a horizontal isolation region of said circuit and at least one bipolar power transistor integrated in the same chip, comprising the steps of:

growing a first epitaxial layer with a first conductivity type on a substrate with the same conductivity type;

growing a second epitaxial layer with a second conductivity type opposite to the first conductivity type on the first epitaxial layer;

defining, in the second epitaxial layer, a region with the first conductivity type to create a buried layer of the integrated control circuit, and further defining a region with the first conductivity type designed to form the emitter of the power transistor;

growing a third epitaxial layer with the first conductivity type over the second epitaxial layer;

forming a trench through the third and second epitaxial layers for their entire depth;

subsequently filling the trench with dielectric material and to constitute an isolation region for the power stage of the control circuit and to level all the junctions subject to high voltage;

providing, in the third epitaxial layer, regions with the second conductivity type designed to isolate the integrated control circuit components from each other; and providing, in the third epitaxial layer, sink regions designed to connect at the surface the buried layer of the integrated control circuit and the power transistor emitter.

4. The method of claim 3, wherein the step of forming the trench comprises the step of forming the trench through the third and second epitaxial layers by selective anisotropic etching.

* * * * *